United States Patent
Kamiya

[11] Patent Number: 6,043,128
[45] Date of Patent: Mar. 28, 2000

[54] SEMICONDUCTOR DEVICE HANDLING MULTI-LEVEL VOLTAGES

[75] Inventor: Takayuki Kamiya, Hamamatsu, Japan

[73] Assignee: Yamaha Corporation, Japan

[21] Appl. No.: 09/017,417

[22] Filed: Feb. 2, 1998

[30] Foreign Application Priority Data

Feb. 7, 1997 [JP] Japan ................................... 9-025664

[51] Int. Cl.[7] ............................................. H01L 21/336
[52] U.S. Cl. ........................................ 438/289; 438/911
[58] Field of Search ................................. 438/258, 275, 438/217, 259, 239, 289

[56] References Cited

U.S. PATENT DOCUMENTS

| | | | |
|---|---|---|---|
| 4,435,896 | 3/1984 | Parrillo et al. | |
| 4,535,529 | 8/1985 | Jochems | 438/217 |
| 4,651,406 | 3/1987 | Shimizu et al. | 438/275 |
| 4,753,898 | 6/1988 | Parrillo et al. | |
| 5,607,868 | 3/1997 | Chida et al. | 438/258 |
| 5,712,201 | 1/1998 | Lee et al. | 438/239 |
| 5,834,352 | 11/1998 | Choi | 438/275 |

FOREIGN PATENT DOCUMENTS 2-58261  2/1990  Japan .

*Primary Examiner*—Wael Fahmy
*Assistant Examiner*—William David Coleman

[57] ABSTRACT

A method of fabricating a multi power source semiconductor device handling multi-level voltages, comprises the steps of: forming first gate oxide layers by thermally oxidizing surfaces of the plurality of the active regions of said semiconductor substrate; forming a first mask having a window on a first active region among said plurality of the active regions of said semiconductor substrate; implanting impurity ions for controlling a threshold voltage, into a surface of said first active region through the first mask; removing the first gate oxide layer on the first active region exposed in the window of said first mask; removing said first mask; forming a thin second gate oxide layer on the first active region and a thick third gate oxide layer on a second active region different from the first active region among said plurality of the active regions by further thermally oxidizing the surfaces of the plurality of the active regions; forming on the semiconductor substrate a second mask having a window on the second active region; and implanting impurity ions for controlling a threshold voltage, into a surface of the second active region through said second mask. A method of fabricating a multi power source semiconductor device capable of realizing gate oxide layers of different thickness and different channel doping with a small number of masks is provided.

3 Claims, 8 Drawing Sheets

SEMICONDUCTOR DEVICE HANDLING MULTI-LEVEL VOLTAGES

BACKGROUND OF THE INVENTION a) Field of the Invention

The present invention relates to a method of fabricating a semiconductor device, and more particularly to a method of fabricating a multi power source semiconductor device handling multi-level voltages.

b) Description of the Related Art

Semiconductor elements in a semiconductor integrated circuit device are miniaturized due to highly concentrated integration. A driving voltage of a semiconductor integrated circuit has a tendency to be lowered in order to save electric power and to establish such an electric field in the miniaturized element that is not excessively high. For example, an analogue circuit such as transistor-transistor logic (TTL) has been developed by 5 V power source. However, a digital circuit developed later is commonly driven by 3.3 V power source. The driving power source for the digital circuit has a tendency to be further decreased to 2.5 V. In a memory device or another device, further lowering of the driving voltage is performed.

Sometimes it is required to handle multi-level voltages on an integrated circuit device containing several kinds of functional circuits. Such a semiconductor device is named as multi power source semiconductor device in the present specification. The multi power source semiconductor device comprises a high voltage circuit driven by a power source of comparatively high voltage and a low voltage circuit driven by a power source of comparatively low voltage.

For example, in an n-type metal-oxide-semiconductor (MOS) transistor, the source electrode is commonly grounded or earthed and the earth potential and the source voltage are selectively applied to the drain electrode and the gate electrode. It is required that the gate oxide layer has a dielectric breakdown voltage higher than the source voltage and that the insulating property doesn't show aging by application of the voltages. Furthermore, it is required that a breakdown voltage between the drain and the source electrodes is higher than the source voltage and that the properties of the element do not show aging. In a multi power source device, the low voltage circuit and the high voltage circuit are different in the level of the voltage applied to a transistor.

In some kinds of multi power source semiconductor devices, a distance between the drain and the source regions in a MOS transistor for low voltage circuit is made to be different from that in a MOS transistor for high voltage circuit. The distance between the drain and the source regions of a transistor is commonly determined from the length of the gate electrode (gate length) so that the gate length is short in a MOS transistor for low voltage circuit and long in that for high voltage circuit. Hence, it is capable of providing an efficient MOS transistor applicable to both low voltage and high voltage circuits by varying the gate length corresponding to the source voltages. Formation of transistors with various gate lengths is easy as it is a planar-pattern problem.

In some kinds of multi power source devices, the thickness of the oxide layer of a MOS transistor for low voltage circuit is made to be different from that of a MOS transistor for high voltage circuit. The MOS transistor for low voltage circuit has a thin gate oxide layer and that for high voltage circuit has a thick gate oxide layer. Hence, it is capable of providing an efficient MOS transistor applicable to both low voltage and high voltage circuits by varying the thickness of the gate oxide layer corresponding to the source voltage. However, in order to form the gate oxide layers different in thickness, the number of steps for forming the gate oxide layers is required to be more than two.

An example of fabricating a multi power source complementary MOS (CMOS) semiconductor device with gate oxide layers having different thicknesses will be described referring to FIGS. 2A to 2F.

For example, in the surface region of a p-type semiconductor substrate 101, p-type wells 102p and 104p and n-type wells 102n and 104n are formed and a field oxide layer 105 is formed to confine active regions on the substrate surface as shown in FIG. 2A. The p-type well 102p and the n-type well 102n are the regions for forming for example, CMOS transistors of low voltage circuit of 3 V and the p-type well 104p and the n-type well 104n are the regions for forming for example, CMOS transistors of high voltage circuit of 5 V.

On the surface of each active region confined by the field oxide layer 105, the first gate oxide layer 106 of about 12 nm thick is formed.

As shown in FIG. 2B, a resist mask R1 having a window on the low voltage circuit region is formed on the semiconductor substrate. The gate oxide layer 106 exposed in the window on the surface of the active region is removed by etching using the resist mask R1. At the same time, the field oxide layer 105 exposed to the window is also etched. However, most of the field oxide layer remains because of its thickness of more than 300 nm. The resist mask R1 is removed after removing the gate oxide layer in the low voltage circuit region.

As shown in FIG. 2C, the semiconductor substrate surface is further oxidized thermally to form the second gate oxide layer 107 of about 9 nm thick on the active region in the low voltage circuit region. Simultaneously, thermal oxidization of the active region in the high voltage circuit region also proceeds to change the first gate oxide layer 106 of 12 nm thick into the third gate oxide layer 108 of about 14 nm thick.

After the second gate oxidation, boron (B) ions are implanted into the entire exposed surface of the substrate at an accelerating energy of 15 keV at a dose of $6.0 \times 10^{11}$ cm$^{-2}$. By the ion implantation, a threshold voltage of the p-type well 104p is controlled.

As shown in FIG. 2D, a resist mask R2 having a window on the p-type well 102p is formed on the surface of a semiconductor substrate. A threshold voltage of the p-type well 102p is controlled by implanting boron ions at an accelerating energy of 15 keV at a dose of $6.0 \times 10^{11}$ cm$^{-2}$, by use of the resist mask R2. After the ion implantation, the resist mask R2 is removed.

As shown in FIG. 2E, a resist mask R3 having a window on the n-type well 102n is newly formed on the semiconductor substrate. Using the resist mask R3, boron ions are implanted at an accelerating energy of 15 keV at a dose of $2.2 \times 10^{12}$ cm$^{-2}$. By the ion implantation, a threshold voltage of the n-type well 120n is controlled. After the ion implantation, the resist mask R3 is removed.

As shown in FIG. 2F, a resist mask R4 having a window on the n-type well 104n is formed on the substrate surface. Using the resist mask R4, boron ions are implanted at an accelerating energy of 15 keV at a dose of $2.5 \times 10^{12}$ cm$^{-2}$. By the ion implantation, the threshold voltage of the n-type well 104n is controlled.

By these four ion implantations, boron ions are implanted into the p-type well 102p, the n-type well 102n, the p-type well 104p, and the n-type well 104n at the doses of $1.2\times10^{12}$ cm$^{-2}$, $2.8\times10^{12}$ cm$^{-2}$, $6.0\times10^{11}$ cm$^{-2}$ and $3.1\times10^{12}$ cm$^{-2}$, respectively. Thus, channel dopings to each of the CMOS transistors for low and high voltage circuits are performed so that the threshold voltage of each transistor is controlled.

In FIG. 2C, ions are implanted into the entire surface of substrate at a dose fitting to the lowest value of channel doping so that four kinds of dose can be realized using only three masks in the three steps shown in FIGS. 2D, 2E, and 2F. However, in order to form the gate oxide layers having different thicknesses, the resist mask R1 is used in FIG. 2B so that the total number of masks in the steps shown in FIGS. 2A to 2F amounts to four.

As described above, in fabricating a multi power source CMOS semiconductor device, four masks were needed to realize formation of the gate oxide layers with two kinds of thickness and to realize four kinds of channel doping. In process of fabricating a semiconductor device, the number of masks has a significant influence on the production cost and on the fabrication efficiency. It is desirable to decrease the number of masks as less as possible in order to decrease the production cost and to increase the fabrication efficiency.

SUMMARY OF THE INVENTION

It is an object of the present invention to provide a method of fabricating a multi power source semiconductor device capable of forming gate oxide layers having different thicknesses and of performing channel dopings at different concentrations, using a small number of masks.

According to one aspect of the present invention, there is provided a method of fabricating a multi power source semiconductor device comprising the steps of: a) preparing a semiconductor substrate defining a plurality of active regions; b) forming first gate oxide layers by thermally oxidizing surfaces of the plurality of the active regions of the semiconductor substrate; c) forming a first mask having a window on a first active region among the plurality of the active regions of the semiconductor substrate; d) implanting impurity ions for controlling a threshold voltage into a surface of the first active region through the first mask; e) removing the first gate oxide layer on the first active region exposed in the window of the first mask; f) removing the first mask; g) forming a thin second gate oxide layer on the first active region and a thick third gate oxide layer on a second active region different from the first active region among the plurality of the active regions; h) forming on the semiconductor substrate a second mask having a window on the second active region; and i) implanting impurity ions for controlling a threshold voltage, into a surface of the second active region through the second mask.

The mask used for removal of the gate oxide layer in part of the active regions so as to grow the gate oxide layers having different thicknesses is also used as a mask for the ion implantation. Hence, the number of masks can be decreased by one.

As above-mentioned, the number of masks used for forming gate oxide layers of different thicknesses and a plurality of regions for MOS transistors of different channel dopings is decreased. As a result, it is possible to improve the fabrication efficiency and to decrease the production cost.

DESCRIPTION OF THE PREFERRED EMBODIMENTS

Referring to the accompanying drawings, embodiments of the present invention will be described. The description will be made on an example of a method of fabricating a multi power source CMOS semiconductor device. The invention is not limited only to this embodiment.

Figure 1A:
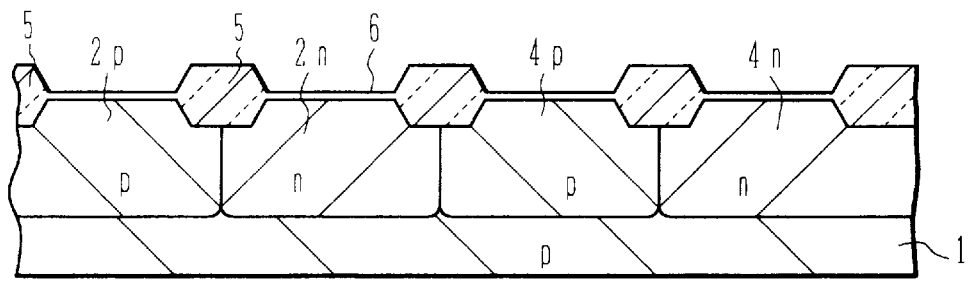
FIGS. 1A to 1Q are schematic cross sectional views of a semiconductor substrate for illustrating a method of fabricating a multi power source semiconductor device according to an embodiment of the present invention.

As shown in FIG. 1A, a p-type well 2p, an n-type well 2n, a p-type well 4p and an n-type well 4n are formed in the surface region of a p-type silicon substrate 1. The p-type well 2p and the n-type well 2n are the regions for forming CMOS transistors of a low voltage circuit. The p-type well 4p and the n-type well 4n are the regions for forming CMOS transistors of a high voltage circuit. A field oxide layer 5 having a sufficient thickness (for instance, more than 300 nm) is formed to define active regions in the wells by a well-known technique of local oxidation of silicon (LOCOS). The wells may be formed after formation of the field oxide layer.

The first gate oxide layer 6 is grown for example, to about 12 nm thick on each of the active regions defined by the field oxide layer 5 by use of thermal oxidation. Next, in order to make the gate oxide layers in the high-voltage circuit regions 4p and 4n thicker than the gate oxide layers in the low voltage circuit regions 2p and 2n, the gate oxide layers in the low voltage circuit region will be removed.

Figure 1B:
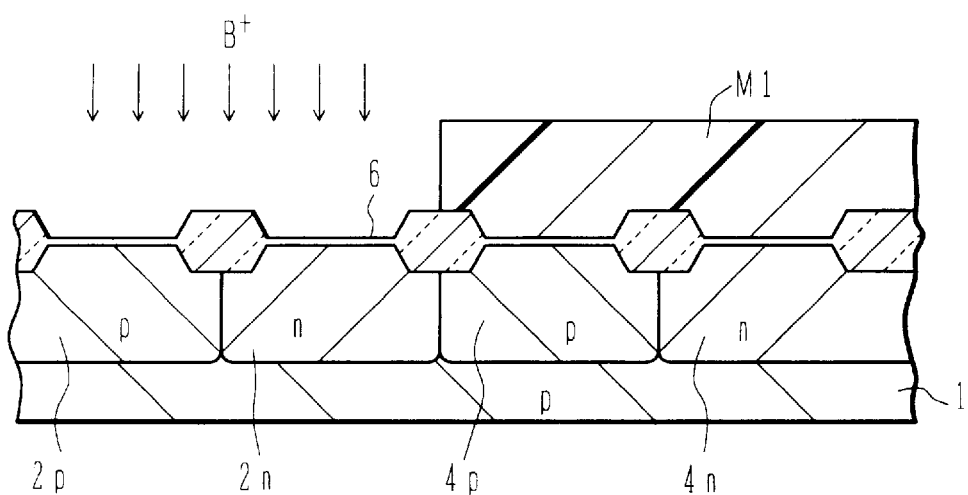

As shown in FIG. 1B, a resist mask M1 is formed to cover the high voltage circuit regions 4p and 4n on the semiconductor substrate. At this stage, boron ions (B$^+$) are implanted at an accelerating energy of 15 keV at a dose of $1.2\times10^{12}$ cm$^{-2}$ using the resist mask M1 as an implantation mask. The dose is determined by taking into account the amount of impurity atoms which will be incorporated into a newly grown oxide layer in the step of the second gate oxidation to be carried out later.

Figure 1C:
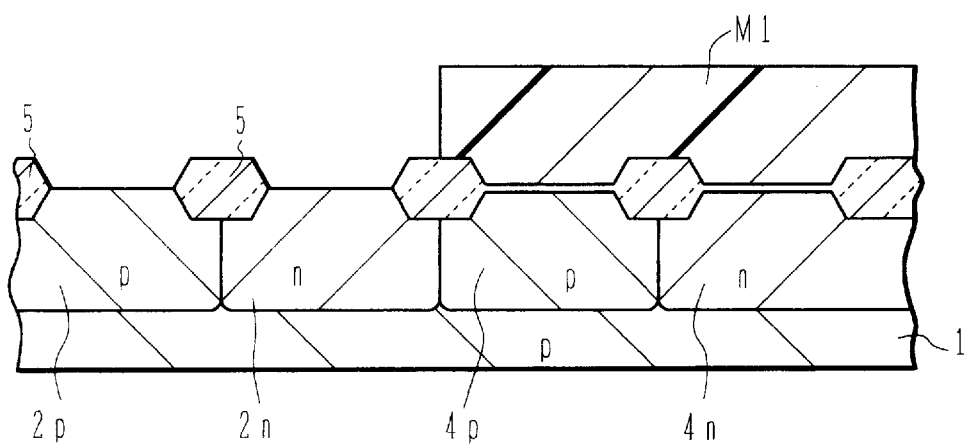

As shown in FIG. 1C, following the boron implantation, the gate oxide layers 6 on the p-type well 2p and the n-type well 2n in the low voltage circuit region are removed by wet etching with dilute fluoric acid using the same mask M1 as in the boron implantation. Since the field oxide layer 5 is for instance, more than 300 nm in thickness, being very thick compared with the gate oxide layer, most of the field oxide layer remains. After wet etching, the resist mask M1 is removed.

Figure 1D:
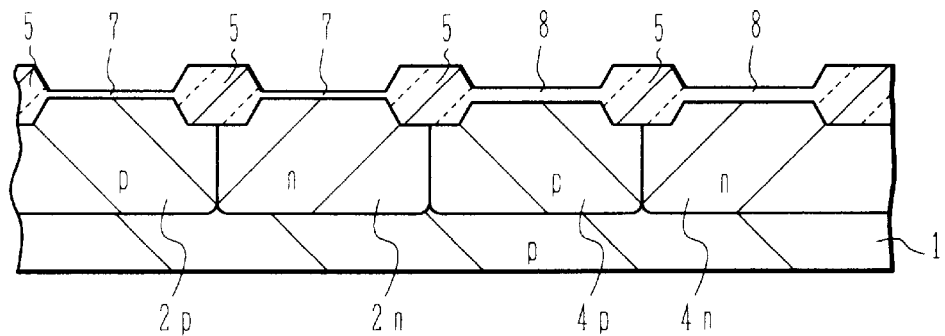

As shown in FIG. 1D, the second gate oxidation is carried out on the surface of the semiconductor substrate. For example, gate oxide layers 7 of about 9 nm thick are grown by thermal oxidation on the p-type well 2p and the n-type well 2n where the previously formed gate oxide layers 6 have been removed. Gate oxidation proceeds also on the p-type well 4p and the n-type well 4n with remaining gate oxide layers 6 so that the gate oxide layers 8 of about 14 nm thick are formed.

Figure 1E:
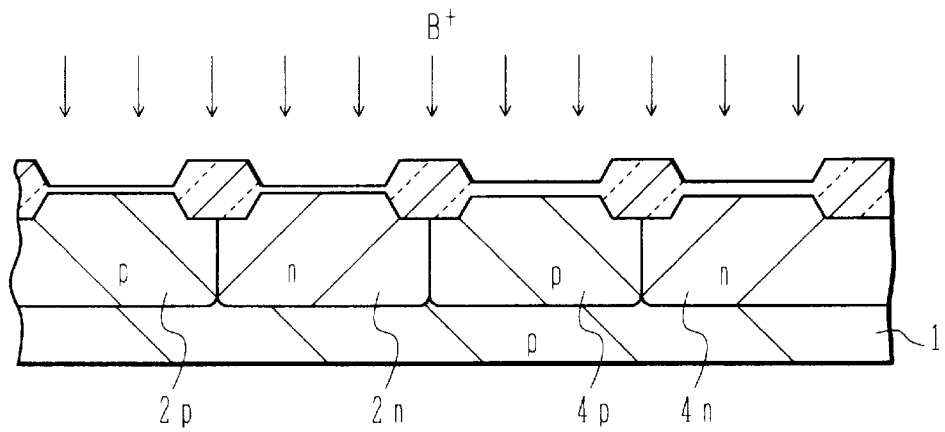

As shown in FIG. 1E, boron ions (B$^+$) are implanted into the entire surface of the substrate at an accelerating energy of 15 keV at a dose of $6.0\times10^{11}$ cm$^{-2}$. By this ion implantation and the boron implantation shown in FIG. 1B, control of the threshold voltages of the p-type wells 2p and 4p is completed.

Figure 1F:
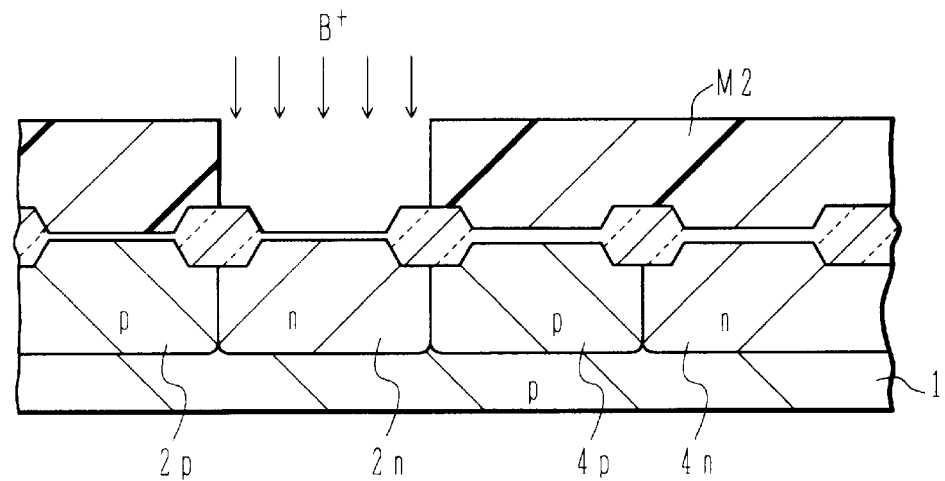

As shown in FIG. 1F, a resist mask M2 having a window on the n-type well 2n in the low voltage circuit region is formed on the semiconductor substrate. Using the mask M2 as an implantation mask, boron ions are implanted at an accelerating energy of 15 keV at a dose of $1.6 \times 10^{12}$ cm$^{-2}$. By this implantation and the boron implantations shown in FIGS. 1B and 1E, control of the threshold voltage of the n-type well 2n is completed. After the ion implantation, the resist mask M2 is removed.

Figure 1G:
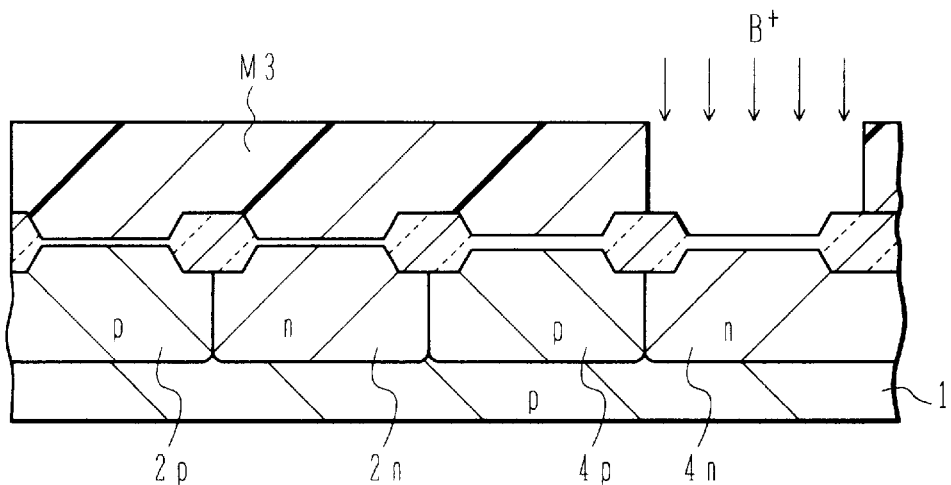

As shown in FIG. 1G, a resist mask M3 having a window on the n-type well 4n in the high voltage circuit region is formed on the semiconductor substrate. Using the mask M3 as an implantation mask, boron ions are implanted at an accelerating energy of 15 keV at a dose of $2.5 \times 10^{12}$ cm$^{-2}$. By this ion implantation and the boron implantation shown in FIG. 1E, control of the threshold voltage of the n-type well 4n is completed. After the ion implantation, the resist mask M3 is removed.

Ion implantations are carried out four times between the steps shown in FIG. 1B and FIG. 1G to control the threshold voltages of the MOS transistors formed in the four kinds of the well 2p, 2n, 4p and 4n at desired values. The gate oxide layers in the low voltage circuit regions are once removed and the second gate oxidation is carried out so that the gate oxide layers with two kinds of thickness are formed. Compared with the prior art described referring to FIGS. 2A to 2F, it is noted that an equivalent device structure can be realized with a number of masks reduced by one.

Hereafter, according to the conventional fabrication process, CMOS transistors of low voltage circuit are formed in the low voltage circuit regions which are the p-type well 2p and the n-type well 2n and CMOS transistors of high voltage circuit are formed in the high voltage circuit regions which are the p-type well 4p and the n-type well 4n.

Figure 1H:
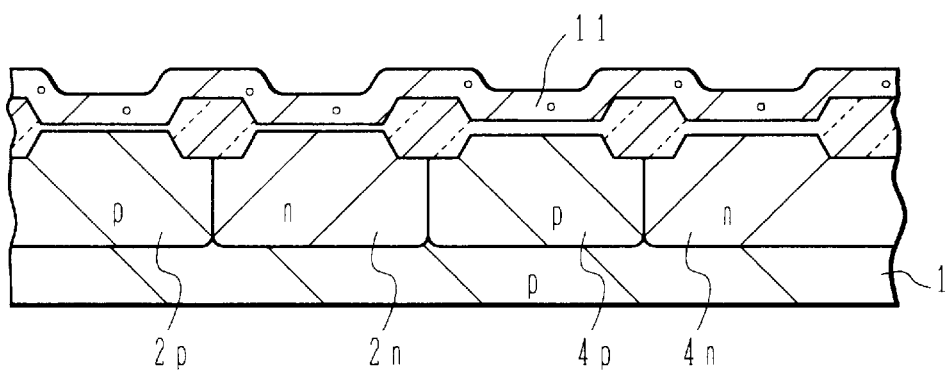

As shown in FIG. 1H, a polycrystalline silicon layer 11 is grown on the substrate to a thickness of about 300 nm by low pressure chemical vapor deposition (LPCVD). The polycrystalline silicon layer 11 is doped with phosphorus to a concentration of about $1 \times 10^{21}$ cm$^{-3}$.

Conditions of growing the polycrystalline silicon layer are for example, as follows.

The growing method is LPCVD.

The source gases are SiH$_4$+PH$_3$.

The flow rates of source gases are SiH$_4$=0.4 slm, and PH$_3$=0.03 slm.

The ambient pressure in the growth chamber is 40 Pa.

The growth temperature is 600° C.

Figure 1I:
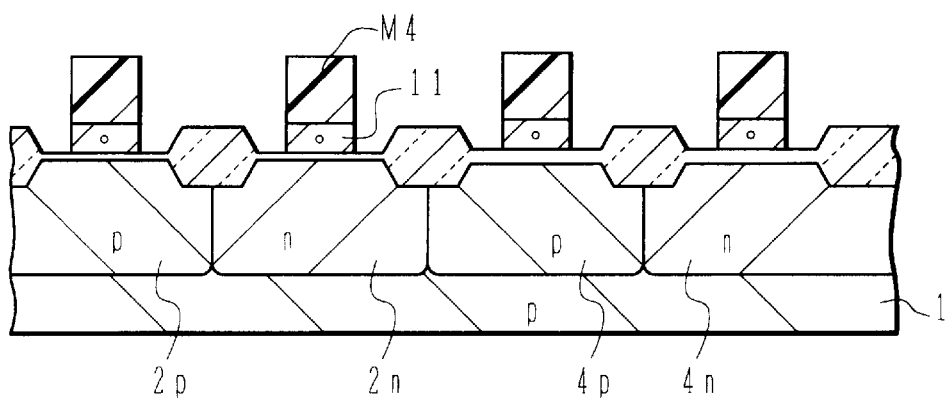

As shown in FIG. 1I, a resist mask M4 is formed on the polycrystalline silicon layer 11. The resist mask M4 is formed in the shape of the gate electrode (wiring) on each of the transistors. Using the resist mask M4 as an etching mask, the polycrystalline silicon layer 11 is anisotropically dry-etched to form polycrystalline silicon electrodes 11. The anisotropic dry etching is carried out by for example, electron cyclotron resonance (ECR) plasma etching using SF6 as an etching gas. After etching the polycrystalline silicon layer 11, the mask M4 is removed.

Figure 1J:
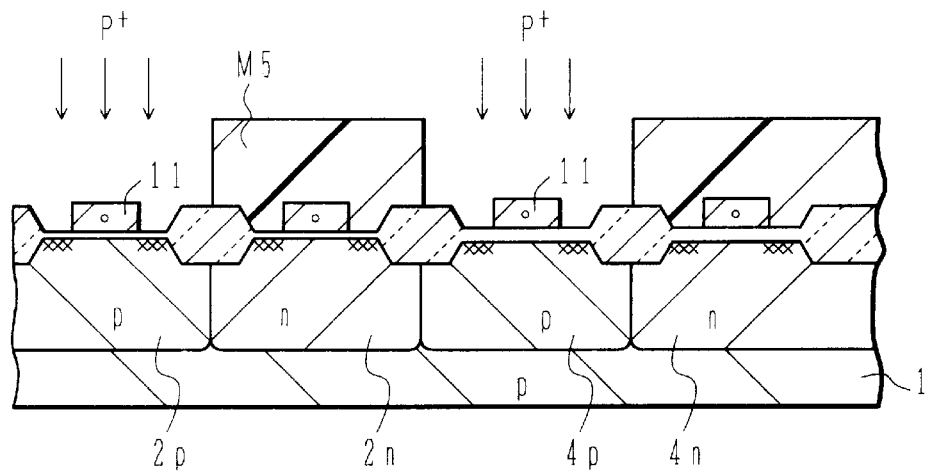

As shown in FIG. 1J, a mask M5 covering the n-type wells 2n and 4n and exposing the p-type wells 2p and 4p is formed on the semiconductor substrate. Using the mask M5 as an implantation mask, implantation of n-type impurity for lightly doped drain (LDD) structure is carried out. For example, phosphorus ions (P$^+$) are implanted to achieve an impurity concentration of about $1.0 \times 10^{17}$ cm$^{-3}$. After the ion implantation, the resist mask M5 is removed.

Figure 1K:
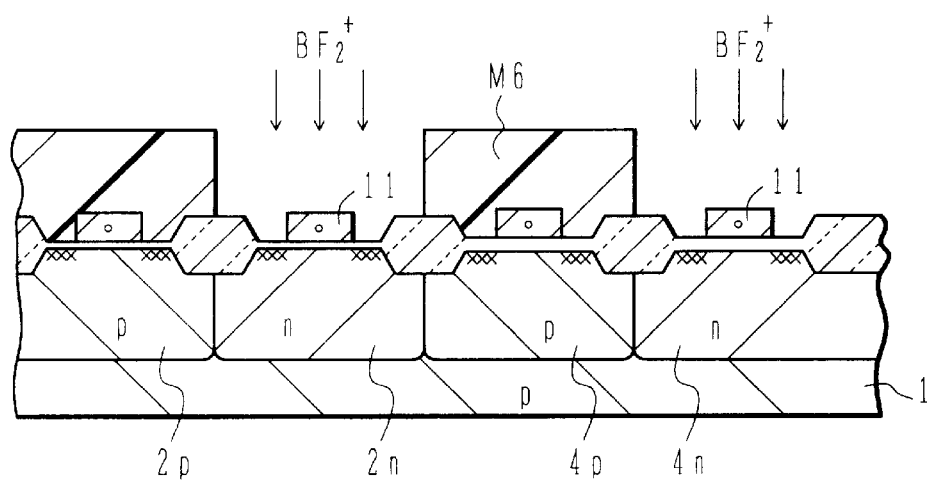

As shown in FIG. 1K, a resist mask M6 exposing the n-type wells 2n and 4n and covering the p-type wells 2p and 4p is formed on the semiconductor substrate. Using the mask M6 as an implantation mask, p-type impurity ions are implanted to form LDD structure of the p-channel MOS transistor. For example, BF$_2$ ions are implanted to achieve an impurity concentration of about $2.0 \times 10^{17}$ cm$^{-3}$. After the ion implantation, the resist mask M6 is removed. In this way, the ion implantations for the LDD structures of the respective n-channel and p-channel MOS transistors are carried out.

Figure 1L:
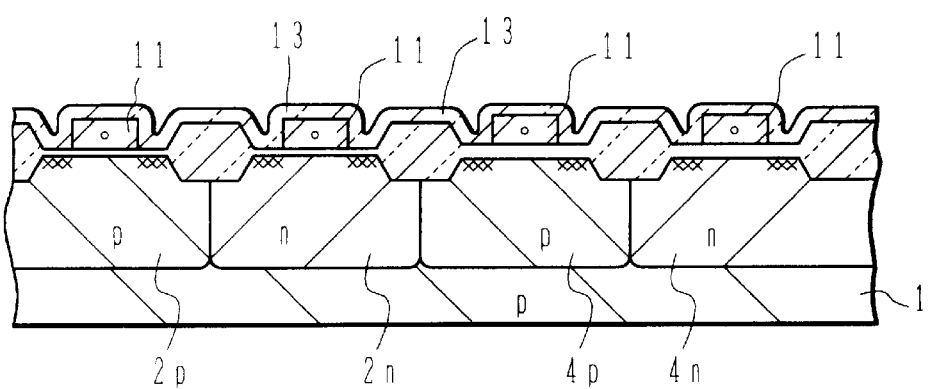

As shown in FIG. 1L, a silicon oxide layer 13 is deposited on the entire surface of the semiconductor surface to a thickness of about 150 nm by low pressure chemical vapor deposition (LPCVD). The deposition conditions for the silicon oxide layer are for example, as follows.

The growing method is LPCVD.

The source gas is Si(OC$_2$H$_5$)$_4$.

The flow rate is 0.02 slm.

The ambient pressure in the deposition chamber is 30 Pa.

The deposition temperature is 750° C.

Figure 1M:
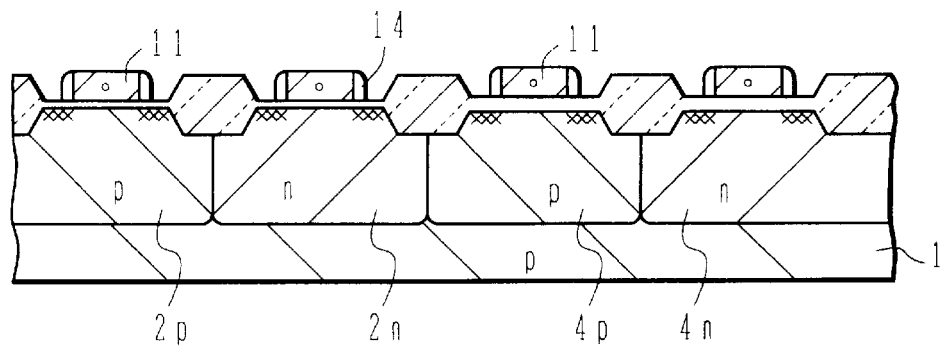

As shown in FIG. 1M, the silicon oxide layer 13 is anisotropically etched to leave only those portions on the side walls of the gate electrode 11 as side spacers 14. The anisotropic etching is carried out by for example, reactive ion etching (RIE) using CHF$_3$ as an etchant gas.

Figure 1N:
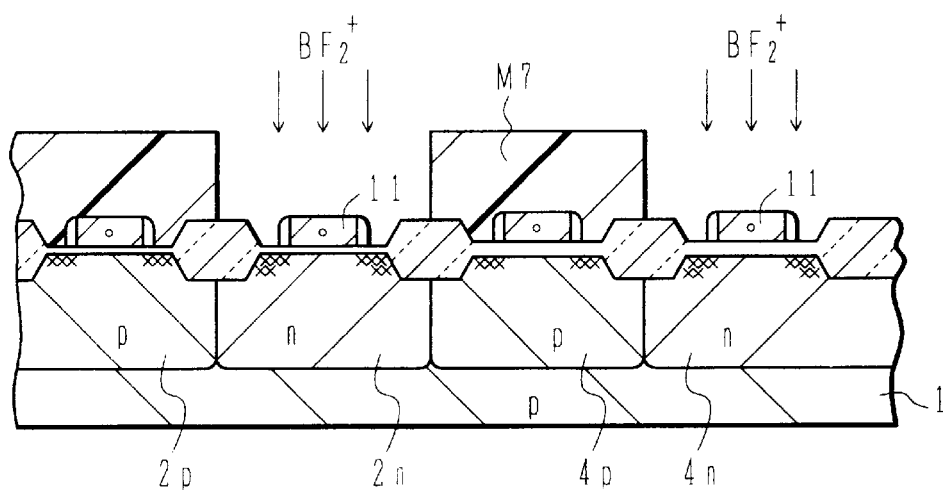

As shown in FIG. 1N, a resist mask M7 is formed on the substrate covering the p-type wells 2p and 4p and exposing the n-type wells 2n and 4n. Using the mask 7 as an implantation mask, p-type impurity ions are implanted at a high concentration. For example, BF$_2$ ions are implanted at an accelerating energy of 40 keV at a dose of $3.0 \times 10^{15}$ cm$^{-2}$. By this ion implantation, the heavily-doped source/drain regions in p-channel MOS transistors are formed. After the ion implantation, the resist mask M7 is removed.

Figure 1O:
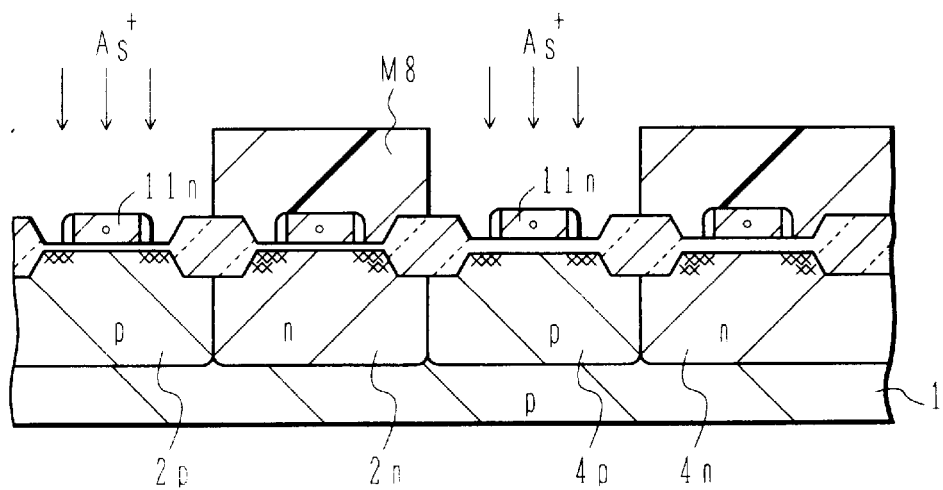

As shown in FIG. 1O, a resist mask M8 is formed on the semiconductor substrate covering the n-type wells 2n and 4n and exposing the p-type wells 2p and 4p. Using the resist mask M8 as an implantation mask, ion implantation of n-type impurity is carried out to form the heavily-doped source/drain regions in the n-channel MOS transistors. For example, arsenic(As) ions are implanted at an accelerating energy of 40 keV at a dose of $5.0 \times 10^{15}$ cm$^{-2}$. Instead of arsenic, phosphorus may be used for ion implantation. After the ion implantation, the resist mask M8 is removed.

To activate the implanted impurity ions, a short-time annealing at 1000° C. for about 10 seconds is carried out by for example, rapid thermal annealing (RTA).

Figure 1P:
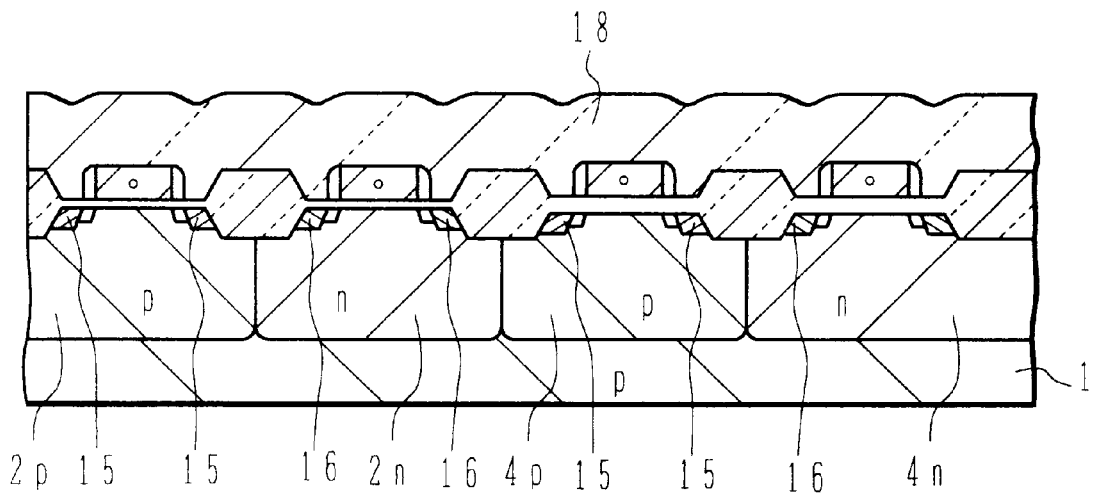

As shown in FIG. 1P, source/drain regions 15 of n-channel MOS transistors and source/drain regions 16 of p-channel MOS transistors are formed by the activation. Thereafter, an interlayer insulating layer 18 is deposited on the semiconductor substrate. For example, the interlayer insulating layer 18 is formed by a lamination of silicon oxide and borophosphosilicate glass (BPSG) layers formed by CVD. Thereafter, heat treatment for planarizing the surface is performed to reflow the BPSG layer.

Figure 1Q:
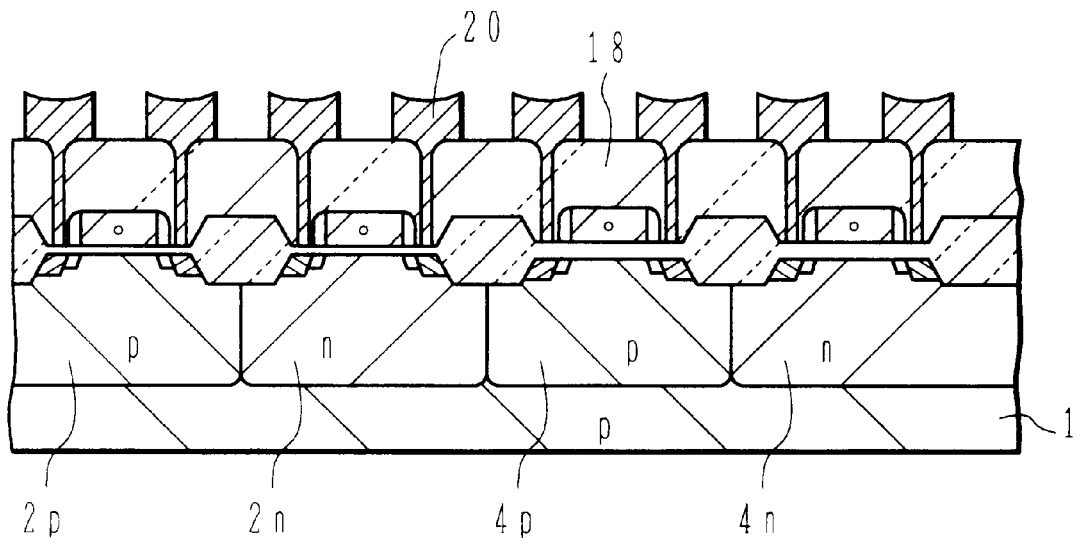
Figure 2A:
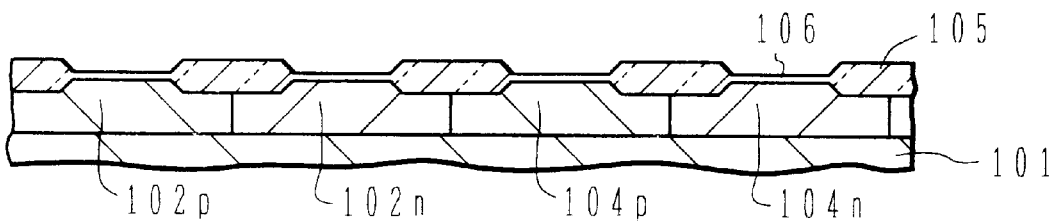
FIGS. 2A to 2F are schematic cross sectional views of a semiconductor substrate for illustrating a method of fabricating a multi power source CMOS semiconductor device according to the prior art.
Figure 2B:
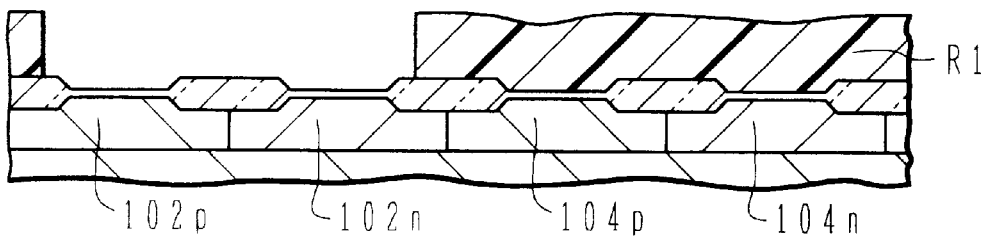
Figure 2C:
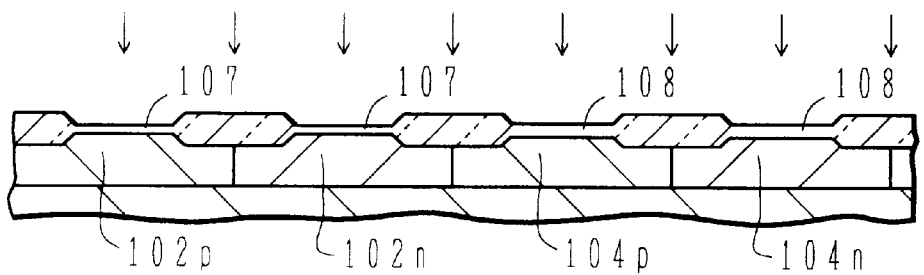
Figure 2D:
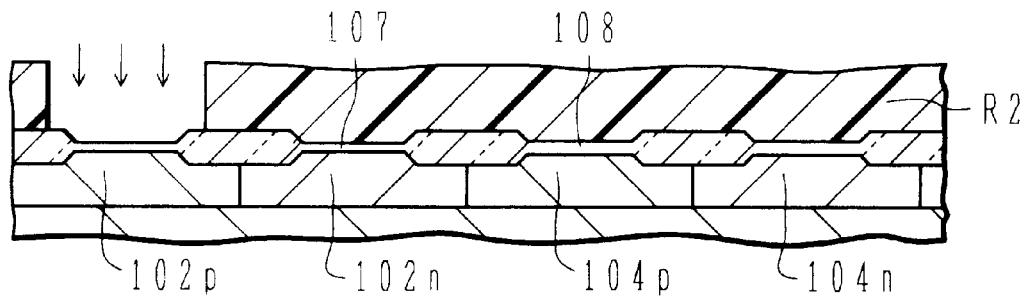
Figure 2E:
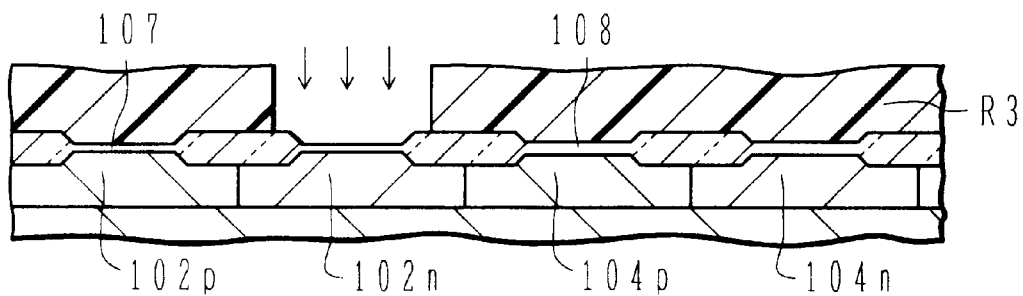
Figure 2F:
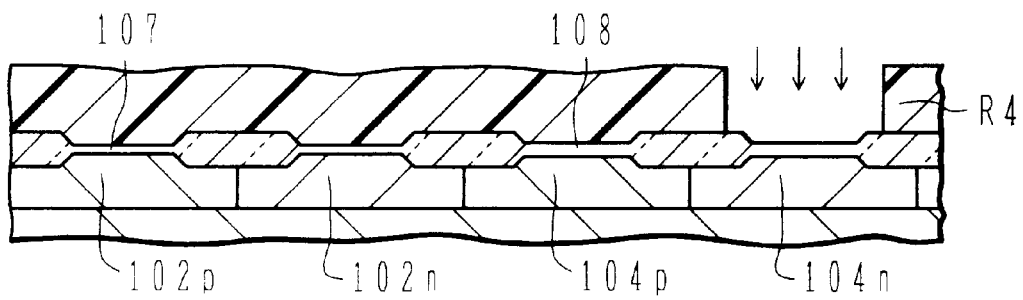

As shown in FIG. 1Q, desired contact holes are formed through the interlayer insulating layer 18. A wiring layer, for example, of aluminum, is deposited and then patterned to form electrodes 20. Thus, a multi power source CMOS semiconductor device is fabricated. After forming an upper level interlayer insulating layer on the wirings shown in FIG. 1Q and forming connecting holes, an upper level wiring is formed to make connection between the upper and lower level wirings. The wiring material is not limited to Al. A polycide structure may be used for the gate electrode.

Though the present invention has been described on a case of fabricating a multi power source CMOS semiconductor device as an example, another semiconductor device may also be fabricated. For example, instead of the CMOS transistors, a multi power source semiconductor device having only n-channel MOS transistors or p-channel MOS transistors may be fabricated. In this case, the conductivity type of the impurity doped to form highly doped source/drain regions or LDD regions is only one type. Hence, the number of steps correspondingly decreases. In order to form gate oxide layers of different thickness for low voltage circuit and for high voltage circuit, part of the gate oxide layers is once removed and thereafter the second gate oxidation is carried out. An ion implantation step for the low voltage circuit is carried out using the same mask as used for removing part of the gate oxide layers, similar to the above-mentioned embodiment.

The present invention has been described in connection with the preferred embodiments. The invention is not limited only to the above embodiments. It will be apparent to those skilled in the art that various modifications, improvements, combinations and the like can be made.

What are claimed are:

1. A method of fabricating a multi power source semiconductor device comprising the steps of:
    a) preparing a semiconductor substrate defining a plurality of active regions, including first and second active regions;
    b) forming first gate oxide layers by thermally oxidizing surfaces of the plurality of the active regions of said semiconductor substrate;
    c) forming a first mask having a window on the first active region on said semiconductor substrate;
    d) implanting impurity ions for controlling a threshold voltage, into a surface of said first active region through said first mask;
    e) removing said first gate oxide layer on said first active region exposed in the window of said first mask;
    f) removing said first mask;
    g) forming a thin second gate oxide layer on said first active region and thickening the remaining first gate oxide layer on a second active region different from said first active region by further thermally oxidizing the surfaces of said plurality of the active regions;
    h) forming on said semiconductor substrate a second mask having a window on said second active region; and
    i) implanting impurity ions for controlling a threshold voltage, into a surface of said second active region through said second mask.

2. A method according to claim 1, wherein: said first active region includes first conductivity type region and a second conductivity type region, the second conductivity type being opposite to the first conductivity type, said first mask has a window on said first and second conductivity type regions of said first active region, said second active region includes a first conductivity type region and a second conductivity type region, and said second mask has a window on the first or the second conductivity type region of the second active region, said method further comprising, after said step g, the steps of:
    a) implanting impurity ions for controlling a threshold voltage, into said plurality of the active regions;
    b) forming on said semiconductor substrate a third mask having a window on the first or second conductivity type region of said first active region; and
    c) implanting impurity ions for controlling a threshold voltage, into the first or second conductivity type region of said first active region through said third mask.

3. A method according to claim 2, wherein the region exposed in the window of said second mask is the first conductivity type region of said second active region, the method further comprising the steps of:
    a) forming on said semiconductor substrate a fourth mask having a window on the second or the first conductivity type region of said second active region; and
    c) implanting impurity ions for controlling a threshold voltage, into the second or the first conductivity type region of said second active region through said fourth mask.

* * * * *